United States Patent [19]
Rodder

[11] Patent Number: 5,192,706
[45] Date of Patent: Mar. 9, 1993

[54] METHOD FOR SEMICONDUCTOR ISOLATION

[75] Inventor: Mark S. Rodder, University Park, Tex.

[73] Assignee: Texas Instruments Incorporated, Dallas, Tex.

[21] Appl. No.: 575,259

[22] Filed: Aug. 30, 1990

[51] Int. Cl.⁵ .......................................... H01L 21/76
[52] U.S. Cl. .................................... 437/67; 437/228; 437/944; 148/DIG. 127
[58] Field of Search ................... 437/67, 228, 944; 148/DIG. 50, DIG. 86, DIG. 100, DIG. 127, DIG. 169

[56] References Cited

U.S. PATENT DOCUMENTS

| | | | |
|---|---|---|---|
| 4,444,605 | 4/1984 | Slawinski | 29/576 W |
| 4,526,631 | 7/1985 | Silvestri et al. | 148/DIG. 26 |
| 4,541,167 | 9/1985 | Havemann et al. | 29/576 W |
| 4,758,531 | 7/1988 | Beyer et al. | 437/67 |
| 4,842,675 | 6/1989 | Chapman et al. | 156/643 |

FOREIGN PATENT DOCUMENTS

| | | | |
|---|---|---|---|
| 58-56353 | 4/1983 | Japan | 437/67 |
| 59-117234 | 7/1984 | Japan | 437/67 |
| 62-136852 | 6/1987 | Japan | 437/67 |
| 1-184634 | 3/1989 | Japan | 437/67 |

OTHER PUBLICATIONS

Ehara, K., "Planar Interconnect Technology . . . Lift-Off Process", J. Electrochem. Soc.: Solid State Science & Technology, vol. 131, No. 2, Feb. 1984.
Wolf, S., Silicon Processing for the VLSI Era, vol. 1, ©1986, pp. 182–183, 184–187.
IBM Technical Disclosure Bulletin vol. 27, No. 12, May 1985, pp. 6981–6982.

Primary Examiner—G. Fourson
Attorney, Agent, or Firm—Richard A. Stoltz; James C. Kesterson; Richard L. Donaldson

[57] ABSTRACT

This is a method of forming a semiconductor integrated circuit with isolation regions, (possibly wide and narrow) comprising of a thin oxide film and deposited anisotropic oxide. It uses an inorganic layer (e.g. noncrystalline silicon) to mask what will be active areas and allows for the growth of a thermal oxide film in the trenches reducing the parasitic channel formation along the trenches. The use of anisotropic oxide to fill the trenches allows for wide and narrow trenches to be simultaneously filled to the desired depth. The removing of inorganic layer and the use of anisotropic oxide to fill the trenches produces a flat planar surface and finer isolation regions.

8 Claims, 2 Drawing Sheets

METHOD FOR SEMICONDUCTOR ISOLATION

BACKGROUND OF THE INVENTION

This invention pertains in general to a semiconductor integrated circuit, and more particularly relates to an improved method of isolating active devices.

In integrated circuit technology, it is necessary to separate the active regions containing active devices from one another. In early bipolar integrated circuits, the active regions were generally electrically isolated from each other by PN junctions. However, with increasing demand for higher device densities, it has become necessary to reduce the isolation areas.

In VLSI integrated circuits using MOS technology, isolation of active regions has usually been accomplished by LOCOS (Local Oxidation of Silicon). To perform LOCOS, a patterned nitride on top of a thin oxide stack is used to cover what will be active areas of a silicon substrate. By exposing the uncovered regions of the silicon substrate to a high temperature oxidizing ambient, a relatively thick field oxide is grown only in the exposed regions.

However, the LOCOS technique grows field oxide not only vertically in the exposed silicon regions, but also laterally underneath the edges of the nitride mask. This lateral oxide encroachment under the nitride, known as "birds-beak," can extend laterally to a distance of about half the field oxide thickness; thus, substantial real estate is wasted in this isolation technology. With the standard LOCOS process, the field oxide thickness has to be scaled down appropriately in order to reduce the birds-beak, otherwise, the remaining active areas will be inadequate for forming active devices. The reduction in field oxide thickness, however, degrades the circuit performance because of increased interconnect capacitance. In addition, the leakage current under the field oxide and between adjacent active areas increases rapidly with decreasing oxide thickness for a given voltage applied to a conductor passing over the field oxide, resulting in reduced isolation between adjacent active areas.

Further problems are encountered when using LOCOS to form wide and narrow isolation regions simultaneously. In particular, since the growth of field oxide is vertical and lateral, the thickness of grown field oxide in narrow regions can be substantially less than in wide regions. Thus, to achieve a desired field oxide thickness in narrow regions, a much larger field oxide is grown in wide regions with concomitant much larger "birds-beak".

Isolation between two adjacent components of the integrated circuit can also be achieved with the use of minimum surface area by etching a trench extending into the substrate between the two components and then refilling the trench with an insulator. Trench isolation uses much less surface area than does either diffused junction isolation or local oxide isolation.

High quality integrated circuits require the semiconductor material along the edge of the trench to be of high integrity with a minimum of process induced defects. Reactive ion etching, which is a preferred method for anisotropically etching trenches, has a tendency to produce a thin defect layer along the trench walls. Defects of this type degrade device performance by forming parasitic channels along the trench to active region junction which increase leakage currents.

To reduce the formation of such a parasitic channel along the trench, the insulating layer directly adjacent to the trench edges is desired to be a thermally grown silicon dioxide layer.

SUMMARY OF THE INVENTION

Accordingly, it is an object of this invention to provide a more effective method of fabricating a semiconductor integrated circuit, which is capable of simultaneously fabricating narrow and wide isolation regions.

It is a further object of this invention to provide a method of fabricating a semiconductor integrated circuit, which is capable of providing a flat planar surface without any bird's beak on the semiconductor body, by utilizing relatively simple steps and minimizing the problems of trenches.

It is a still further object of this invention to provide a method of fabricating a semiconductor integrated circuit, which minimizes process induced defects along the walls of the trench, thus providing a good interface between the isolation region and the semiconductor body.

The present invention provides a method for forming a semiconductor integrated circuit with trenches around selected areas on a semiconductor body, wherein an inorganic layer (e.g. noncrystalline silicon) is formed on the top surface of a semiconductor body. Wide and narrow trenches may be formed around selected areas, (possibly wide and narrow) on a semiconductor body, while the selected areas are masked by the inorganic layer. Silicon may then be removed from the walls of the trenches followed by growth of thin thermal oxide along trench edges, thus reducing the thin defect layer. Trenches are then filled with anisotropically deposited silicon material (e.g. oxide). Lastly, removing (e.g. etching) the inorganic layer lifts off the anisotropic layer deposited above the inorganic layer.

The invention can use removing of silicon from the walls of the trenches and subsequent growth of thin thermal oxide along trench edges to minimize the defects along the trench edges and provide a good interface between the isolation region and the semiconductor body, thus reducing formation of parasitic channels along trench edges.

The invention's use of anisotropic fill in the trenches allows for wide and narrow trenches to be simultaneously filled.

The invention's preferable use of removing the inorganic, nonoxide and the use of anisotropic silicon oxide to fill the trenches produces a flat planar surface (flush with the surface of the semiconductor body) without any bird's beak and produces finer isolation regions.

DETAILED DESCRIPTION OF THE PREFERRED EMBODIMENTS

Figure 1:
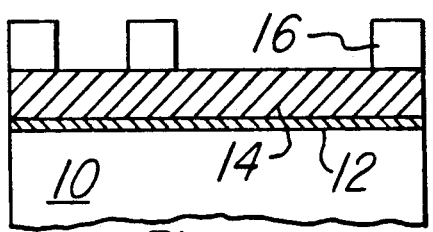
FIGS. 1 through 7 illustrate a preferred method for forming a semiconductor integrated circuit with wide and narrow isolation regions around selected areas on a semiconductor body according to this invention.
Figure 2:
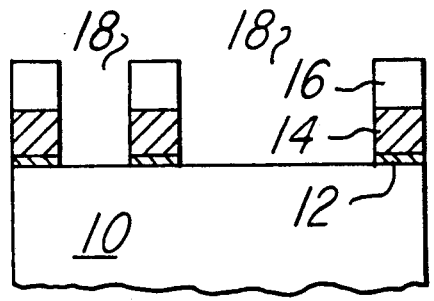

Referring to FIG. 1, an integrated circuit semiconductor body 10 is prepared, which may have n-type and p-type wells formed (not shown). Within the wells, generally, active and passive devices (not shown) will be formed which may need to be isolated from the remainder of the circuitry on the semiconductor body 10. The semiconductor body 10 is thermally oxidized to form an oxide layer 12 of preferably 300 to 1000 Angstroms in thickness. A noncrystalline silicon layer 14 is deposited on the entire surface of the oxide layer 12 with a thickness of 2000 to 5000 Angstroms. A photoresist film is applied on the entire surface of the noncrystalline silicon layer 14. The photoresist layer is selectively removed to form a photoresist mask 16 having narrow and wide openings, wherein the width of narrow openings is approximately 0.5 micrometers and the width of wide openings is of the order twice or greater than the width of narrow openings. The exposed portions of the noncrystalline silicon layer 14 are then etched by an etch which is selective to silicon over oxide. The structure is then subjected to an etch process to remove the exposed oxide layer 12, so that openings 18 are formed over selected surfaces of the semiconductor body 10 (to form the intended isolation regions as shown in FIG. 2).

Figure 3:
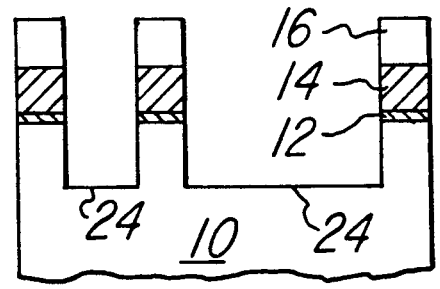

Referring to FIG. 3, the structure obtained is subjected to an anisotropic etching process to form trenches 24 to a depth preferably of 0.3 to 1.5 micrometers.

Figure 4:
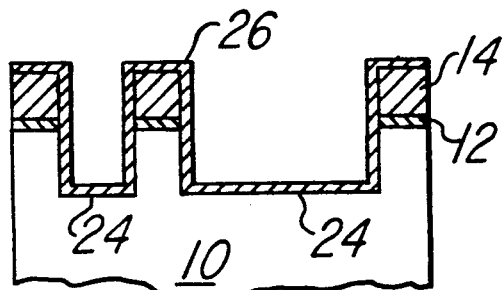

Referring to FIG. 4, after removing the photoresist mask 16, the structure is then subjected to a wet silicon etch (if desired) to remove etch damage and is then oxidized at a high temperature, preferably above 800 degrees C. This results in an oxide film 26, with a thickness of approximately 100 to 800 Angstroms, being formed on the entire surface of the structure including the sides and bottom of the trenches 24. The higher oxidized temperature allows for a much faster rate of growth and a more uniform oxidation of the trench edges (than if performed at lower temperatures). An optional stripping of the oxide film 26 and regrowing the oxide film 26 to further reduce defects along the trench edges can be performed at this step.

Figure 5:
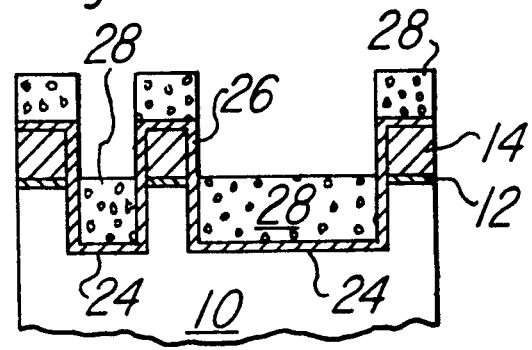

Referring to FIG. 5, the entire surface of the structure obtained is subjected to an anisotropically deposited oxide 28 to a preferable thickness which fills or slightly overfills the trenches with negligible introduction of defects along the trench walls.

Figure 6:
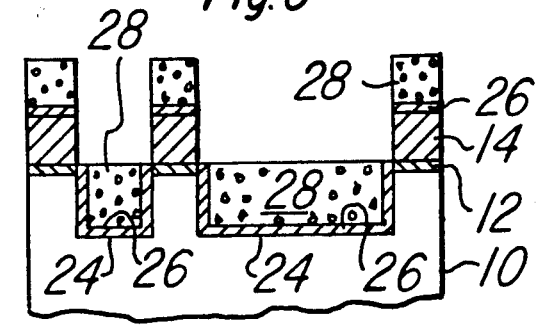
Figure 7:
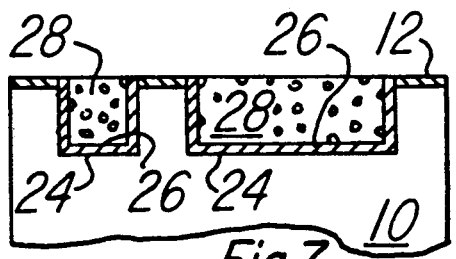

Referring to FIG. 6, preferably a short wet oxide etch is utilized to remove the portion of oxide film 26 which is on the lateral edge of the noncrystalline silicon 14. The structure is then subjected to an isotropic etch selective to oxide which laterally etches the noncrystalline silicon 14 and lifts off the anisotropic oxide 28 deposited on top of the noncrystalline silicon 14 and exposing the oxide 12 on top of the selected areas 12 of the semiconductor body as shown in FIG. 7. An inorganic, non-oxide, such as noncrystalline silicon can be removed, by etching or other means, without removal of the oxide 12 protecting the semiconductor body 10.

Figure 8:
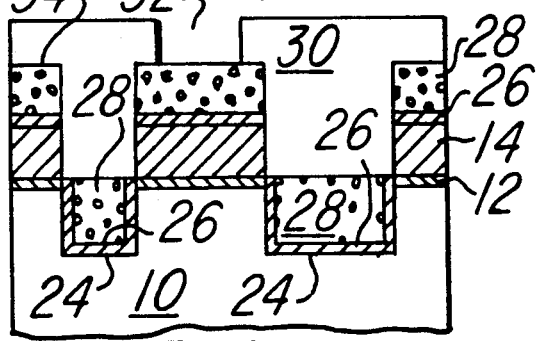

A variation to the above steps is required when the noncrystalline silicon 14 above the active areas 20 is wide so that the isotropic lateral etch cannot adequately remove the noncrystalline silicon 14 in a practical etch time. FIG. 8 is similar to FIG. 5, but having a wide active region and narrow active regions. Before the structure is subjected to the isotropic etch, a photoresist masking layer 30 is formed exposing a wide region 32 of anisotropically deposited oxide 28 on top of the noncrystalline silicon 14 while narrow regions 34 remain covered. An etch then removes the wide region 32 of the anisotropic silicon oxide 28 and of the thermal oxide 26.

Figure 10:
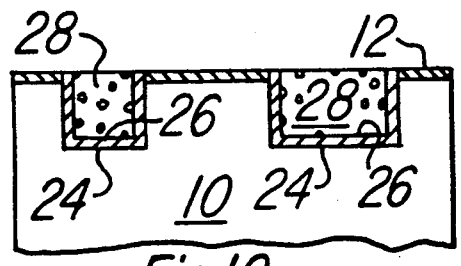
FIGS. 8 through 10 illustrate a preferred method for forming a semiconductor integrated circuit with wide and narrow isolation regions around selected wide and narrow areas on a semiconductor body according to this invention.
Figure 9:
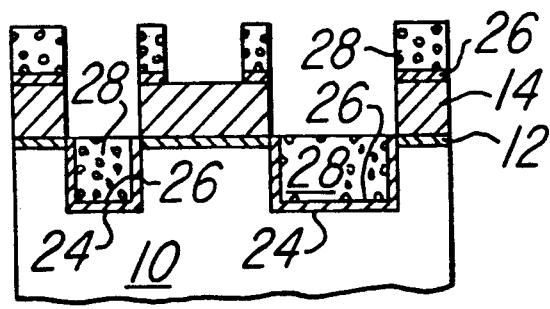

Referring to FIG. 9, the photoresist mask 30 is removed and the structure is then subjected to an isotropic etch which removes the noncrystalline silicon 14 and lifts off the anisotropic silicon oxide 28 deposited on top of the noncrystalline silicon 14 and exposing the oxide 12 on top of the selected areas 12 of the semiconductor body 10, as shown in FIG. 10.

The above-mentioned embodiment of this invention offers the advantages in that an integrated circuit is formed with wide and narrow trenches simultaneously filled with a single deposition, a flat planar surface, and a trench to active region interface which is thermally oxidized reducing interfacial defects and thus preventing parasitic channel formation along trench edges.

It should be noted that this invention is not limited to the aforementioned embodiment, but can be applied in various modifications. For instance, silicon nitride may be used in replace of noncrystalline silicon, or a composite stack of noncrystalline silicon and oxide can be utilized instead of solely noncrystalline silicon. Also, a patterned mask could be used with an etch to remove the undesired anisotropic oxide and noncrystalline silicon instead of the lateral isotropic etch.

The invention is not to be construed as limited to the particular forms described herein, since these are to be regarded as illustrative rather than restrictive. The invention is intended to cover all processes which do not depart from the spirit and scope of the invention.

What is claimed is:

1. A method for isolating a selected area on an integrated circuit, comprising the steps of:
   (a) forming an oxide layer on a top surface of a silicon semiconductor body;
   (b) forming a non-crystalline silicon layer on top of said oxide layer;
   (c) anisotropically forming trenches around selected areas in said semiconductor body;
   (d) removing silicon from the trench walls to remove defects from said walls;
   (e) filling said trenches and covering said non-crystalline silicon layer with anisotropically deposited silicon oxide;
   (f) removing silicon oxide from vertical surfaces of said non-crystalline silicon; and
   (g) removing said non-crystalline silicon layer, thereby removing said deposited silicon oxide layer deposited above said inorganic, non-oxide layer, whereby an integrated circuit is formed with essentially a planar surface and having trenches with walls which are essentially defect-free.

2. The method according to claim 1, wherein said oxide layer is silicon dioxide.

3. The method according to claim 2, wherein said silicon dioxide thickness is approximately 100 to 300 Angstroms.

4. The method according to claim 1, wherein said non-crystalline silicon layer thickness is approximately 2000 to 5000 Angstroms.

5. The method according to claim 1, wherein the depth of said trenches is 0.3 to 1.5 micrometer.

6. The method according to claim 1, wherein said silicon removed from the trench walls is removed by an etchant.

7. The method according to claim 1, wherein said silicon removed from the trench walls is removed by growing silicon oxide at a temperature of at least 800° C.

8. A method for isolating a selected area on an integrated circuit substrate, comprising the steps of:
   (a) forming an amorphous silicon layer on top of said substrate;
   (b) removing portions of said amorphous silicon layer and said substrate to form trenches around selected areas in said semiconductor body;
   (c) anisotropically depositing trench-fill material; and
   (d) removing said amorphous silicon layer thereby removing said deposited trench-fill material deposited above said amorphous silicon layer.

* * * * *